United States Patent [19]

Erhardt

[11] 4,014,728
[45] Mar. 29, 1977

[54] METHOD OF MAKING AN IMAGING MEMBER

[75] Inventor: Peter F. Erhardt, Webster, N.Y.

[73] Assignee: Xerox Corporation, Stamford, Conn.

[22] Filed: Mar. 29, 1976

[21] Appl. No.: 671,239

Related U.S. Application Data

[62] Division of Ser. No. 527,664, Nov. 27, 1974, Pat. No. 3,979,495.

[52] U.S. Cl. .................................. 156/244; 96/1.5; 264/158; 264/176 R
[51] Int. Cl.² .......................................... B29D 7/18
[58] Field of Search ........... 156/244; 264/108, 148, 264/158, 176 R; 96/1.5

[56] References Cited

UNITED STATES PATENTS

| | | | |
|---|---|---|---|
| 2,017,705 | 10/1935 | Sproxten | 264/108 |
| 3,227,784 | 1/1966 | Blades et al. | 264/176 R |
| 3,501,330 | 3/1970 | Cassiers et al. | 264/176 R |
| 3,547,761 | 12/1970 | Rasmussen | 156/244 |
| 3,553,069 | 1/1971 | Rasmussen | 156/244 |
| 3,725,505 | 4/1973 | O'Malley | 260/881 |

*Primary Examiner*—Caleb Weston

[57] ABSTRACT

A method of forming an imaging member consisting essentially of (a) preparing a photoconductive layer comprising a block copolymer which exhibits a lamellar morphology, said copolymer having lamellae of at least 2 phases, one phase comprising a photoconductive material and the other phase an elastomeric material, with said lamellae being disposed in a direction substantially normal to the horizontal plane of said layer and (b) placing said layer upon a conductive substrate.

1 Claim, 2 Drawing Figures

METHOD OF MAKING AN IMAGING MEMBER

CROSS-REFERENCE TO RELATED APPLICATIONS

This application is a divisional application of copending U.S. patent application Ser. No. 527,664, filed Nov. 27, 1974, now U.S. Pat. No. 3,979,495.

BACKGROUND OF THE INVENTION

This invention relates to xerography and more specifically to a novel photosenstive member and a method of making such a member.

The art of xerography involves the use of a photosensitive element or plate containing a photoconductive insulating layer which is usually first uniformly electrostatically charged in order to sensitize its surface. The plate is then exposed to an image of activating electromagnetic radiation such as light, x-ray, or the like, which selectively dissipates the charge in the exposed areas of the photoconductive insulator while leaving behind a latent electrostatic image in the non-exposed areas. This latent electrostatic image may then be developed and made visible by depositing finely divided electroscopic marking particles on the surface of the photoconductive layer. This concept was originally disclosed by Carlson in U.S. Pat. No. 2,297,691, and is further amplified and described by many related patents in the field.

One type of photoconductor used in xerography is illustrated by U.S. Pat. No. 3,121,006 to Middleton and Reynolds which describes a number of binder layers comprising finely divided particles of photoconductive inorganic compound dispersed in an organic electrically insulating resin binder. It has been found that structures of the Middleton et al type must use a substantially continuous particle-to-particle contact for the photoconductive material throughout the layer in order to permit the charge dissipation required for cyclic operations. With uniform photoconductor dispersions, relatively high volume concentrations of photoconductor up to about 50 percent or more by volume is usually necessary in order to obtain sufficient photoconductor particle-to-particle contact for rapid discharge. It has been found, however, that high photoconductor loadings in binder layers of this type result in the physical continuity of the resin being destroyed and thereby significantly reduce the mechanical properties of the binder layer. Layers with high photoconductor loadings are often characterized by a brittle binder layer having little or no flexibility. On the other hand, when the photoconductor concentration is reduced appreciably below about 50 percent by volume, the discharge rate is reduced, making high speed cyclic or repeated imaging difficult or almost impossible.

In U.S. Pat. No. 3,787,208 to R. N. Jones, the above problems of high photoconductor loading are obviated by a novel xerographic photoreceptor which includes a binder layer which comprises photoconductive particles dispersed in a controlled geometry in an insulating resin matrix. More specifically, substantially all of the photoconductive particles, which are present in a concentration of 1 to 25 percent bu volume, are in the form of a plurality of continuous photoconductive paths through the thickness of the binder layer.

The present invention is directed to overcoming the above problems noted in the prior art, and to provide a novel method of making a photoconductive or charge transport layer having a controlled geometry analogous to that set forth in the 3,787,208 patent.

OBJECTS OF THE INVENTION

It is therefore an object of this invention to provide a method of making a novel photoreceptor member.

It is another object of this invention to provide a method of making a novel photoreceptor member having a lamellar structure in which at least one phase comprises a photoconductive material.

It is a further object of this invention to provide a method of making an imaging member having a photoconductive layer which exhibits a high degree of mechanical flexibility and excellent electrical characteristics.

SUMMARY OF THE INVENTION

The present invention is directed to a flexible photoreceptor member and a method for making such a member in which the geometry of a block copolymer is used to control a plurality of photoconductive paths in the photoconductive layer. More specifically, a block copolymer is used to control the photoconductive paths of a phtoconductive layer by making use of a lamellar morphology in which at least one phase comprises an organic photoconductive material, and at least one other phase comprises a rubber or elastomeric material. More specifically, the invention contemplates making a block copolymer which includes one photoconductive phase and at least one highly flexible phase in weight ratios such that a lamellar morphology is formed for said structure. This block copolymer is then extruded at relatively high temperatures and pressures in order to substantially align the lamellal of both phases. The resultant structure can then be cut into thin slices or wafers which are suitable for use as a photoconductive layer or charge transport layer in any suitable xerographic or xerographic-type imaging device.

When the above structure is used as a photoconductuve or charge transport layer in an imaging device, the structure is characterized by a plurality of substantially vertical photoconductive paths which pass from the top photoconductive layer surface to the substrate interface or interfacial barrier layer interface. These paths provide electronic pathways which function to effectively discharge the imaging member.

DETAILED DESCRIPTION OF THE INVENTION

The lamellar photoconductive block copolymers of the present invention are used either as a photoconductive layer or charge transport layer in xerographic imaging devices.

Figure 1:
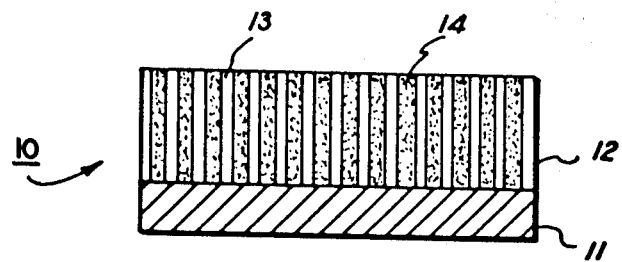
FIG. 1 schematically represents one embodiment of an imaging member of the present invention.

FIG. 1 illustrates one embodiment of the typical xerographic member in which these photoconductive block copolymers are used. Imaging member 10 comprises a supporting substrate 11 overlayed with a relatively thin layer of a photoconductive block copolymer layer 12, which exhibits a lamellar morphology. The lamellar structure comprises at least two phases in a molar ratio of about 30:70 to 70:30, on of which is phase 13 which is photoconductive, and a second phase 14 which is preferably a rubber or elastomeric material. It can be seen from the drawing that a lamellar structure allows for continuous electronic pathways of photoconductor material from the top surface down to the substrate-photoconductor interface. In addition, elastomeric phase 14 provides the device with a high degree of mechanical flexibility.

Substrate 11 is preferably made up of any suitable conductive material. Typical conductors comprise aluminum, steel, brass, conducting polymers or the like. The substrate may be rigid or flexible and of any convenient thickness. The substrate may also comprise a composite structure such as a thin conductive coating contained on a paper base; a plastic coated with a thin conductive layer, such as aluminum, graphite, copper iodide; or glass coated with a thin conductive coating of chromium or tin oxide. If desired, the substrate may also be substantially dielectric or electrically insulating and the device charged by techniques well known in the art for using imaging members having electrically insulating substrates.

In general, photoconductive block copolymer layer 12 may comprise any suitable block copolymer which has at least one photoconductive phase and in which the orientation of lamellar morphology is substantially vertical to the horizontal plane of the supporting substrate.

Suitable block copolymer materials include block copolymers formed by the anionic polymerization of 3-vinyl pyrene or 2-vinyl N-alkyl carbazoles with dienes such as 1,3-butadiene, 1,3-pentadiene (piperylene), 2-methyl-1,3-butadiene (isoprene) and 2,3-dimethyl-1,3-butadiene; and siloxanes such as cyclic octamethyl tetrasiloxane; block copolymers formed by the anionic polymerization of 2-vinylanthracene with dienes such as those described above for 3-vinyl pyrene; and siloxanes such as cyclic octamethyl tetrasiloxane; block copolymers formed by the anionic polymerization of 2-propenyl-2-anthracene with dienes such as those described above for 3-vinyl pyrene and siloxanes such as cyclic octamethyl tetrasiloxane.

Typical monomers which will undergo anionic polymerization with vinylpyrene or any other suitable polynuclear condensed aromatic vinyl to form novel block copolymers according to the process of the invention include dienes such as 1,3-butadiene, 1,3-pentadiene (piperylene), 2-methyl-1,3-butadiene (isoprene), and 2,3-dimethyl-1,3-butadiene; vinyl substituted aromatic hydrocarbons such as styrene, 2-methylstyrene, vinyl toluene, 4-vinyl biphenyl and 1-vinylnaphthalene; vinyl substituted heteroaromatics such as 2-vinylpyridine, 4-vinylpyridine, 3-methyl-5-vinylpyridine, 3,5-diethyl-5-vinylpyridine, and 2-vinylquinoline; methacrylates and acrylates, for example, esters of methacrylic and acrylic acid such as methyl, ethyl, propyl, butyl, hexyl, cyclohexyl, and benzyl; vinyl substituted nitriles and N,N-disubstituted amides such as acrylonitrile, methacrylonitrile, N,N-dimethacrylamide and N,N-diethylmethacrylamide; aldehydes such as formaldehyde, acetaldehyde, butyraldehyde and heptaldehyde; isocyanates such as butyl isocyanate, hexyl isocyanate, phenyl isocyanate, 2-naphthyl, isocyanate, and 2-anthryl isocyanate; siloxanes such as cyclic octamethyl tetrasiloxane; cyclic ethers and cyclic thioethers such as ethylene oxide, ethylene episulfide, propylene oxide and propylene episulfide; cyclic esters or lactones such as caprolactone.

These block copolymers may be made by any convenient techniques well known in the art such as those disclosed in U.S. Pat. No. 3,725,505 to J. J. O'Malley, which is incorporated herein by reference. In general, these copolymers may be made by employing a condensed aromatic ring system capable of undergoing anionic polymerization by contacting a monomer, e.g. vinylpyrene in a reaction zone with a polymerization initiator in the presence of a suitable diluent and allowing the reaction to proceed until the monomer has been substantially completely polymerized. At this point the initiator material will typically be completely exhausted but the polymer which is formed in a "living" polymer, i.e., one which itself has a unit or units which are anionic in nature on the end(s) of the polymer chain and which will allow it to initiate polymerization of another monomer. Subsequently, another monomer of a type which is copolymerizable with the first formed "living" polymer is charged into the reaction zone. The second monomer undergoes polymerization onto the end of the first formed polymer chain until substantially all of the second monomer has been polymerized. A third monomer may then be added to the reaction zone if so desired. In this manner, it is possible to make block copolymers having a number of different segments.

In some instances, following the synthesis of the block copolymer, the lamellal may not be satisfactorily oriented in the proper direction. In this case, it is preferably that the material be extruded in order to obtain the proper ordering or direction of the lamellar morphology. Any conventional extrusion technique may be used, but generally, the extrusion is carried out at an elevated temperature in the range of about 400° to 800° F, at pressures of about 10,000 to 30,000 psi. In one preferred embodiment, the extruded material is obtained in the form of a rod, which is then sectioned following the extrusion process to the desired thickness for use as the photoconductive or charge transport layer.

In another preferred embodiment, the use of an annealing or heat treating step following extrusion in some instances results in a preferred orientation lamellar morphology. This heat treatment is usually carried out at relatively low temperatures in the range of about 200° to 400° C for a relatively long time ranging from about 12 hours to 3 days.

Figure 2:
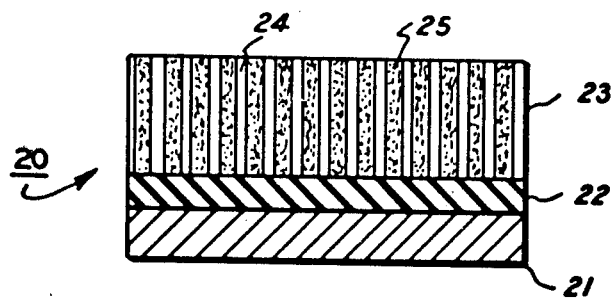
FIG. 2 schematically represents a second embodiment of an imaging member of the present invention.

In an alternative embodiment of the present invention, the photoconductive lamellar structure may be used in a composite device as a charge transport layer which overlays a thin photoconductive layer. This structure is illustrated in FIG. 2 of the drawings by reference character 20 and comprises a supporting substrate 21, a photoinjecting layer 22 of any suitable photoconductor such as vintreous-selenium, selenium alloys, trigonal selenium, cadmium sulfoselenide in a binder, etc. The photoconductive layer is overcoated with a block copolymer layer 23 of the type already described above having photonductive lamellal 24 adjacent elastomeric lamellal 25. In operation, this device is imaged by uniformly charging the block copolymer layer to a uniform potential followed by exposing the imaging member to radiation to which the block copolymer is substantially non-absorbing or transparent, and to which the lower photoconductive layer is substantially absorbing. Positive or negative electrical charges (holes or electrons) generated by the photoconductive layer and moved to the surface to selectively discharge the surface charge, resulting in the formation of a latent electrostatic image which is later developed to form a visible image. These structures are more fully described in U.S. Patent application Ser. No. 371,647, filed June 20, 1973, which is incorporated herein by reference.

DESCRIPTION OF THE PREFERRED EMBODIMENTS

The following examples further specifically define the present invention with respect to a method of making a photosensitive member containing a phtoconductive block copolymer layer which exhibits a lamellar morphology. The percentages are by weight unless otherwise indicated. The examples below are intended to illustrate various preferred embodiments of the present invention.

EXAMPLE I

A block copolymer of 2-vinylanthracene and isoprene is made by the following method. A sample comprising 10 grams of 2-vinylanthracene is purified by passing it through a neutral Woelm alumina column (benzene as eluent). This monomer is collected off the column in a suitable ampoule. The ampoule is placed on a vacuum apparatus and the monomer freeze-dried. After thoroughly evacuating the monomer (10 grams 0.05 moles), 100 mls. dry tetrahydrofuran (THF) was distilled into the ampoule. The ampoule was then sealed and placed in a freezer until needed.

A sample of 5 grams of isoprene is distilled twice from calcium hydride under vacuum. Into a suitable ampoule, 5 grams isoprene (0.05 moles) and 20 mls. THF were distilled. The ampoule was then sealed. The two monomer ampoules were attached to a flask equipped with a rubber septum. The flask was thoroughly degassed and sealed. The breakseal of the isoprene ampoule was crushed and the contents allowed to flow into the flask. The flask was cooled to −78° C and 2 mls. of 0.5 moles butyl lithium in hexane was added.

The solution of "living" poly (isoprene) was allowed to stir overnight at −78° C. The 2-vinylanthracene ampoule was cooled to allow a smooth addition to the reaction flask. The breakseal was crushed and the contents allowed to flow into the flask. An immediate color change to deep red-purple indicative of the 2-vinylanthracene anion. The flask is allowed to stir at −70° C for 6 days. The copolymer solution is quenched with methanol and precipitated in methanol. Filtered. Reprecipitated from THF and methanol.

The product formed by the above technique comprises a block copolymer of 2-vinylanthracene and isoprene in the form of pale yellow powder capable of being formed into a flexible film.

EXAMPLE II

The copolymer material of Example I was fed through a twin-screw extruder (Werner & Pfeiderer Corp., Waldwick, N. J.), at a temperature between about 650° and 750° F, at pressures of about 15,000 to 20,000 psi. The extruded material is obtained in the form of a rod approximately 9 mm in diameter. While the extruded rod shows some macroscopic order (as detected by a low angle X-ray camera), an annealing post treatment was found to enhance the degree of macroscopic order and phase separation. To accomplish this the rods were heated in vacuum at temperatures between 250° and 350° C for lengths of time ranging from 1 to 3 days. Under these conditions, the samples were very soft but still retained their shape under their own weight. In all cases, the heast treatment made the X-ray diffraction patterns more intense and distinct. Thin slices (∼2–10 $\mu$) were cut from the rod and placed over a suitable conductive substrate to form an imaging member with the axis of each disk running normal to the plane of the substrate as illustrated in FIG. 1 of the drawings. These imaging members are satisfactory for use in a xerographic process in which a developable latent electrostatic image is formed on the surface of the photoconductive block copolymer layer.

EXAMPLE III

A second photoconductive block copolymer layer is made by the method of Example I in which 2-propenyl-2-anthracene is substituted for the 2-vinylanthracene. Imaging members are made by the method of Example II, with said members exhibiting satisfactory electrical properties for forming a developable latent electrostatic image.

EXAMPLE IV

A third photoconductive block copolymer is made under high vacuum by the following method. 10 grams of 3-vinylpyrene are added to a previously dried ampoule which is then evacuated to $10^{-5}$ Torr. Subsequently, 100 cc of dry THF is distilled into the ampoule which is then removed from the vacuum line by sealing with a torch. A solution of 5 grams of isoprene in 100 cc of THF is prepared by high vacuum distillation of the monomer and solvent into an ampoule equipped with a breakseal.

The block polymerization is carried out in a 0.5 liter flask equipped with a glass stirrer, vacuum inlet and separate ampoules containing the monomers, the initiator (alpha methylstryene tetramer dianion which is prepared by contacting alpha methylstyrene with sodium metal and THF overnight and filtering off the solids) and the methanol terminating agent. The reactor is evacuated to $10^{-5}$ Torr and 200 cc of THF is vacuum distilled into the flask which is then sealed at 25° C. The initiator ampoule is then opened and 4 cc of 0.12M alpha methylstyrene tetramer dianion in THF is washed into the THF. The monomer solution is then added in similar fashion and the living polyisoprene block is immediately formed. The yellow polyisoprene solution is stirred for one-half hour and the vinylpyrene monomer solution is then added. The solution is stirred for one-half hour and 1 cc of methanol is then added to terminate the reaction. The decolorized solution is then added to a large excess of methanol and the block copolymer is precipitated. The polymer is filtered and oven dried.

The polyvinylpyrene, polyisoprene, polyvinylprene block copolymer is pale yellow, fluorescent and forms flexible films. The molecular weight of the copolymer is about 61,000 and it has a composition of 66 percent polyvinyl pyrene and 34 percent polyisoprene. It is photoconductive when electrically charged and subsequently discharged in the standard xerographic mode and exhibits photoelectrical behavior approximating that of the polyvinylpyrene homopolymer.

Other modifications and ramifications of the present invention would appear to those skilled in the art upon reading the disclosure. These are also intended to be within the scope of this invention.

What is claimed is:

1. A method of forming an imaging member comprising a photoconductive layer having plural photoconductive paths oriented substantially perpendicular to a surface of said layer and a conductive substrate, said method consisting essentially of:

a. preparing a photoconductive block copolymer by anionic copolymerization of a polynuclear condensd aromatic vinyl compound selected from the group consisting of 3-vinylpyrene, 2-vinylanthracene, 2-propenyl-2-anthracene and 2 vinyl-N-alkyl carbazoles with a monomer selected from the group consisting of 1,3-butadiene, 1,3-pentadiene (piperyline), 2-methyl-1,3-butadiene (isoprene) 2,3-dimethyl-1,3-butadiene and cyclic octamethyl tetrasiloxane;

b. extruding and cooling a melt of said copolymer to form an extrusion having lamellae of at least two phases, one phase being photoconductive and the other phase being elastomeric, said lamellae being disposed in a direction lying substantially parallel to the direction of extrusion, and cutting said extrusion transerversely to form said layer; and c. placing said layer upon a conductive substrate, with said lamellae being disposed in a direction substantially normal to the horizontal plane of said substrate to form an imaging member.

* * * * *

UNITED STATES PATENT OFFICE
CERTIFICATE OF CORRECTION

PATENT NO. : 4,014,728
DATED : March 29, 1977
INVENTOR(S) : Peter F. Erhardt

It is certified that error appears in the above-identified patent and that said Letters Patent are hereby corrected as shown below:

Column 1, line 63, "bu" should be --by--.

Column 2, line 24, "phtoconductive" should be --photoconductive--
line 34, "lamellal" should be --lamellae--.
line 41, "tuve" should be --tive--.
line 67, "on" should be --one--.

Column 3, line 4, "toconductor" should be --toconductive--.

Column 4, line 13, "in" should be --is--.
line 27, "lamellal" should be --lamellae--.
line 29, "erably" should be --erable--.
line 54, "vintreous" should be --vitreous--.
line 58, "photonductive" should be --photoconductive--.
line 58, "lamellal" should be --lamellae--.
line 59, "lamellal" should be --lamellae--.

Column 5, line 10, "phtoconduc-" should be --photoconduc- --.

Column 6, line 3, "heast" should be --heat--.

Column 7, line 9, "densd" should be --densed--.

Signed and Sealed this

Twentieth Day of September 1977

[SEAL]

Attest:

RUTH C. MASON
Attesting Officer

LUTRELLE F. PARKER
Acting Commissioner of Patents and Trademarks